United States Patent
Kishida et al.

(10) Patent No.: US 11,356,076 B2
(45) Date of Patent: Jun. 7, 2022

(54) SURFACE ACOUSTIC WAVE FILTER AND MANUFACTURING METHOD THEREFOR

(71) Applicant: THE JAPAN STEEL WORKS, LTD., Tokyo (JP)

(72) Inventors: Kazuhito Kishida, Tokyo (JP); Shoji Kakio, Kofu (JP); Jun Mizuno, Tokyo (JP)

(73) Assignee: THE JAPAN STEEL WORKS, LTD., Tokyo (JP)

( * ) Notice: Subject to any disclaimer, the term of this patent is extended or adjusted under 35 U.S.C. 154(b) by 0 days.

(21) Appl. No.: 17/134,228

(22) Filed: Dec. 25, 2020

(65) Prior Publication Data

US 2021/0226602 A1 Jul. 22, 2021

(30) Foreign Application Priority Data

Jan. 22, 2020 (JP) .............................. JP2020-007972

(51) Int. Cl.
  *H03H 9/02* (2006.01)
  *H03H 9/145* (2006.01)
  *H03H 3/08* (2006.01)
  *H03H 9/64* (2006.01)

(52) U.S. Cl.
  CPC .......... *H03H 9/02574* (2013.01); *H03H 3/08* (2013.01); *H03H 9/02551* (2013.01); *H03H 9/02559* (2013.01); *H03H 9/145* (2013.01); *H03H 9/6406* (2013.01)

(58) Field of Classification Search
  CPC .. H03H 9/02574; H03H 3/08; H03H 9/02551; H03H 9/02559; H03H 9/145; H03H 9/6406; H03H 9/02157
  USPC .......................................... 333/133, 193–196
  See application file for complete search history.

(56) References Cited

U.S. PATENT DOCUMENTS

| | | | |
|---|---|---|---|
| 10,084,427 B2 * | 9/2018 | Solal ........................ | H03H 9/64 |
| 2018/0048282 A1 | 2/2018 | Kurimoto et al. | |
| 2020/0127634 A1 | 4/2020 | Kurimoto et al. | |

FOREIGN PATENT DOCUMENTS

| | | |
|---|---|---|
| JP | 2018-026695 A | 2/2018 |
| JP | 2019-004308 A | 1/2019 |
| JP | 2019-145920 A | 8/2019 |

OTHER PUBLICATIONS

H. Engan, "Excitation of Elastic Surface Waves by Spatial Harmonics of Interdigital Transducers," IEEE Transactions on Electron Devices, Dec. 1969, vol. 16, Issue 12, p. 1014-1017.

* cited by examiner

*Primary Examiner* — Rakesh B Patel
*Assistant Examiner* — Jorge L Salazar, Jr.
(74) *Attorney, Agent, or Firm* — SGPatents PLLC

(57) ABSTRACT

In a surface acoustic wave filter according to an embodiment, a thickness of a piezoelectric crystal substrate bonded over a support substrate made of an oxide crystal is 0.05 to 0.5 μm, and an odd-order harmonic is used.

10 Claims, 5 Drawing Sheets

SURFACE ACOUSTIC WAVE FILTER AND MANUFACTURING METHOD THEREFOR

INCORPORATION BY REFERENCE

This application is based upon and claims the benefit of priority from Japanese patent application No. 2020-007972, filed on Jan. 22, 2020, the disclosure of which is incorporated herein in its entirety by reference.

BACKGROUND

The present disclosure relates to a surface acoustic wave filter and a method for manufacturing a surface acoustic wave filter.

As mobile communication apparatuses such as mobile phones have evolved, it has been desired to improve performance of surface acoustic wave (SAW: Surface Acoustic Wave) filters such as to raise their frequencies and to widen their bands. As disclosed in Japanese Unexamined Patent Application Publications No. 2018-026695, No. 2019-004308, and No. 2019-145920, the inventors of the present application have developed SAW filters in which a piezoelectric crystal substrate is bonded over an oxide substrate such as a quartz-crystal substrate.

The SAW filter includes a comb-like IDT (Interdigital Transducer) electrode formed over the piezoelectric crystal substrate. H. Engan, "Excitation of elastic surface waves by spatial harmonics of interdigital transducers," IEEE Transactions on Electron Devices, December 1969, Vol. 16, Issue 12, p. 1014-1017 (hereinafter referred to simply as Engan) discloses that the relative excitation intensities of odd-order harmonics of a SAW filter with respect to that of the fundamental wave thereof change according to a ratio (a metallization ratio) w/d between the width w of each of electrode fingers and the pitch p of the electrode fingers in an IDT electrode.

SUMMARY

In the development of a surface acoustic wave filter in which a piezoelectric crystal substrate is bonded over an oxide substrate, the inventors have found various problems.

Other problems to be solved and novel features will become apparent from descriptions in this specification and accompanying drawings.

In a surface acoustic wave filter according to an embodiment, a thickness of a piezoelectric crystal substrate bonded over a support substrate made of an oxide crystal is 0.05 to 0.5 μm, and an odd-order harmonic is used.

According to the embodiment, it is possible to provide an excellent surface acoustic wave filter.

The above and other objects, features and advantages of the present disclosure will become more fully understood from the detailed description given hereinbelow and the accompanying drawings which are given by way of illustration only, and thus are not to be considered as limiting the present disclosure.

DESCRIPTION OF EMBODIMENTS

Specific embodiments are explained hereinafter in detail with reference to the drawings. However, the present disclosure is not limited to the below-shown embodiments. Further, the following descriptions and the drawings are simplified as appropriate for clarifying the explanation.

First Embodiment

<Configuration of Radio Receiving Circuit RX Using Surface Acoustic Wave Filter>

Figure 1:
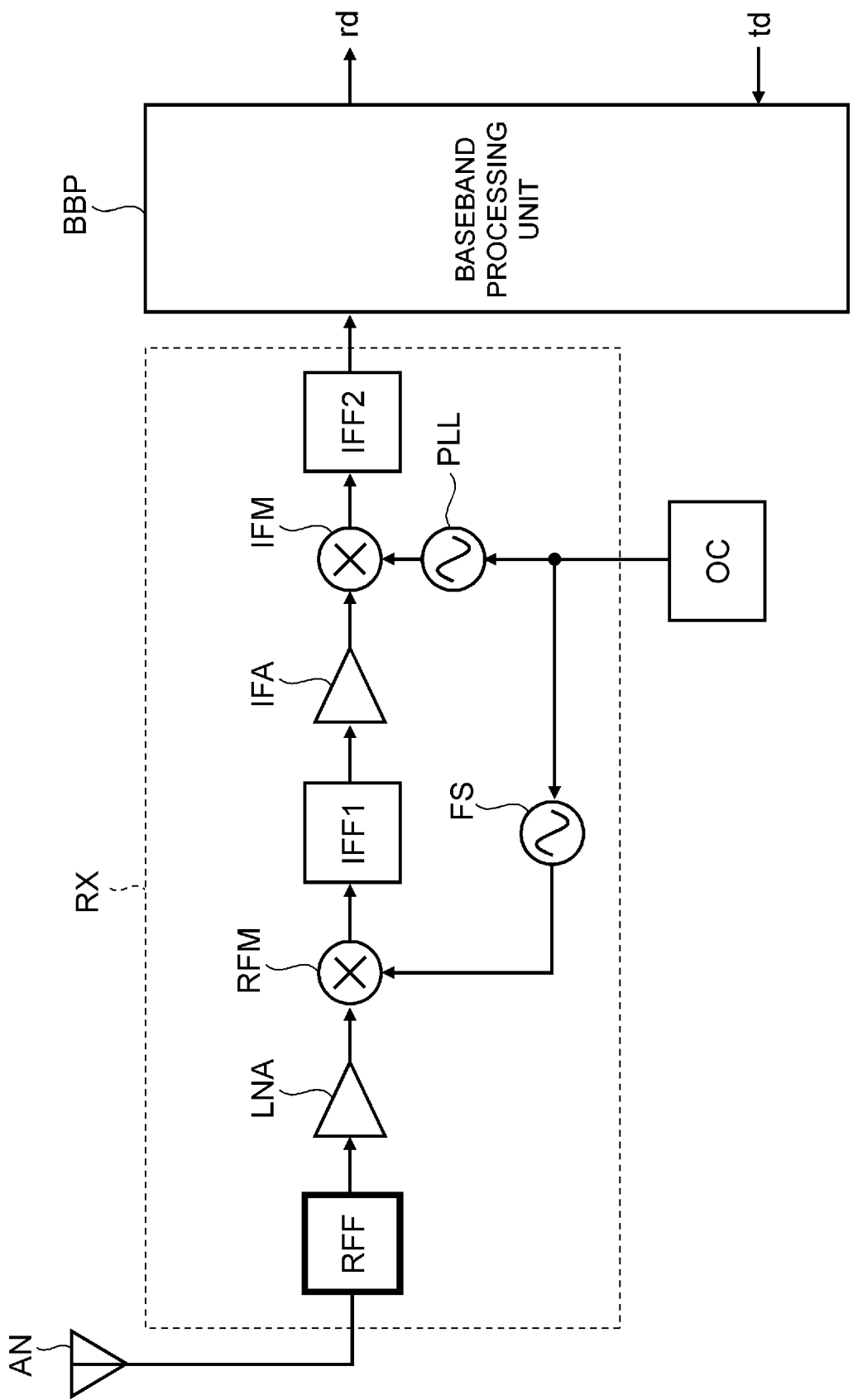
FIG. 1 is a block diagram showing an example of a configuration of a radio receiving circuit RX using an SAW filter according to a first embodiment.

Firstly, a configuration of a radio receiving circuit RX using a surface acoustic wave filter (hereinafter also referred to as an SAW filter) according to a first embodiment will be described with reference to FIG. 1. FIG. 1 is a block diagram showing an example of a configuration of a radio receiving circuit RX using an SAW filter according to the first embodiment. The radio receiving circuit RX shown in FIG. 1 is a superheterodyne-type radio receiving circuit, and is used for, for example, a mobile phone. Note that the radio receiving circuit RX shown in FIG. 1 is merely an example of the use of an SAW filter, and the use of the SAW filter is not limited to any particular use.

Firstly, an outline of the radio receiving circuit RX will be given.

As shown in FIG. 1, the radio receiving circuit RX wirelessly receives a reception RF (Radio Frequency) signal through an antenna AN. Then, the radio receiving circuit RX generates a reception IQ signal from the reception RF signal by using a frequency signal output from an oscillation circuit OC, and outputs the generated reception IQ signal to a baseband processing unit BBP.

Note that the baseband processing unit BBP decodes the reception IQ signal acquired from the radio receiving circuit RX into reception data rd and outputs the obtained reception data rd.

Note that the baseband processing unit BBP encodes acquired transmission data td into a transmission IQ signal and outputs the obtained transmission IQ signal to a radio transmission circuit (not shown). Then, the transmission RF signal generated from the transmission IQ signal in the radio transmission circuit is wirelessly transmitted from the antenna AN.

Next, details of the radio receiving circuit RX will be described.

As shown in FIG. 1, the radio receiving circuit RX includes an RF (Radio Frequency) filter RFF, a low noise amplifier LNA, an RF (Radio Frequency) mixer RFM, IF (Intermediate Frequency) filters IFF1 and IFF2, an IF (Intermediate Frequency) amplifier IFA, an IF (Intermediate Frequency) mixer IFM, a frequency synthesizer FS, and a PLL (Phase Locked Loop) circuit PLL.

A flow of the reception data rd will be described hereinafter.

A reception RF signal wirelessly received by the antenna AN is input to the low noise amplifier LNA through the RF filter RFF and amplified by the low noise amplifier LNA. Note that an SAW filter according to the first embodiment is used for the RF filter RFF. The frequency band (the passband) that the RF filter RFF allows to pass therethrough is, for example, a band of 1.5 to 20 GHz. The SAW filter according to the first embodiment is suitable for a high frequency band because it uses an odd-order harmonic (e.g., a third harmonic) instead of using the fundamental wave.

Further, the RF filter RFF is composed of, for example, a plurality of SAW filters whose passbands are slightly shifted from one another in order to achieve a desired passband width. The electromechanical coupling coefficient $K^2$ of the SAW filter according to the first embodiment is large even for an odd-order harmonic, and its sole passband width is wide. Therefore, it is possible to reduce the number of SAW filters constituting the RF filter RFF and thereby to reduce the size of the radio receiving circuit RX.

Further, the SAW filter according to the first embodiment has a large admittance ratio even for an odd-order harmonic. When the admittance ratio of the SAW filter used for the RF filter RFF is large, the size of the low noise amplifier LNA located behind the RF filter RFF (i.e., connected to the output side of the RF filter RFF) can be reduced and the power consumption of the low noise amplifier LNA can also be reduced. That is, it is possible to reduce the size of the radio receiving circuit RX and also to reduce the power consumption of the radio receiving circuit RX.

Next, the amplified reception RF signal is mixed with a frequency signal output from the frequency synthesizer FS in the RF mixer RFM, and the mixed signal is down-converted into a reception IF signal. The reception IF signal output from the RF mixer RFM is input to the IF amplifier IFA through the IF filter IFF1, and amplified by the IF amplifier IFA.

The amplified reception IF signal is mixed with a frequency signal output from the PLL circuit PLL in the IF mixer IFM, and the mixed signal is demodulated into a reception IQ signal. Then, the reception IQ signal output from the IF mixer IFM is input to the baseband processing unit BBP through the IF filter IFF2, and decoded into reception data rd by the baseband processing unit BBP.

<Configuration of Surface Acoustic Wave Filter>

Next, a configuration of the SAW filter according to the first embodiment will be described with reference to FIG. 2. As described above, the SAW filter according to this embodiment is suitable for a high frequency band, e.g., a band of 1.5 to 20 GHz because it uses an odd-order harmonic instead of using the fundamental wave.

Figure 2:
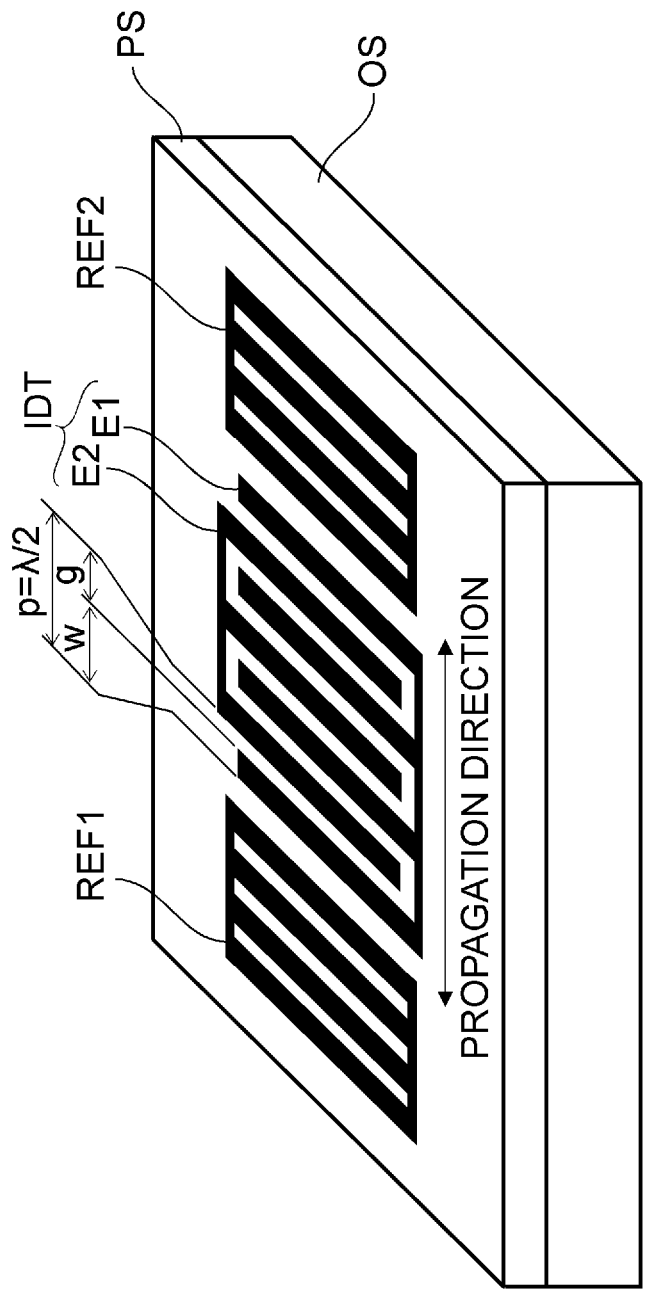
FIG. 2 is a perspective view showing an example of a configuration of the SAW filter according to the first embodiment.

FIG. 2 is a perspective view showing an example of the configuration of the SAW filter according to the first embodiment. As shown in FIG. 2, the SAW filter according to the first embodiment includes an oxide crystal substrate OS, a piezoelectric crystal substrate PS, an IDT electrode IDT, and reflectors REF1 and REF2.

That is, the SAW filter shown in FIG. 2 is a one-port resonator-type SAW filter in which one IDT electrode IDT is disposed between two reflectors REF1 and REF2. Note that the SAW filter may be a two-port resonator-type SAW filter in which two IDT electrodes are disposed between two reflectors REF1 and REF2. Further, the reflectors REF1 and REF2 are not indispensable.

The oxide crystal substrate OS is a single-crystal substrate made of, for example, quartz crystal ($SiO_2$) or sapphire ($Al_2O_3$) that is cut on a predetermined crystal plane. More specifically, the oxide crystal substrate OS is, for example, an AT-cut quartz-crystal substrate in which the propagation direction of surface acoustic waves is inclined from the X-axis of the crystal by 0 to 90° (hereinafter also referred to as an "AT-cut 0-90° X-propagation quartz-crystal substrate"). The thickness of the oxide crystal substrate OS is, for example, 5 to 500 μm.

As shown in FIG. 2, the piezoelectric crystal substrate PS is bonded over the oxide crystal substrate OS which serves as a support substrate. The piezoelectric crystal substrate PS is, for example, a single-crystal substrate made of $LiTaO_3$ (LT), $LiNbO_3$ (LN), or the like cut on a predetermined crystal plane. More specifically, the piezoelectric crystal substrate PS is, for example, an LT substrate in which the cutting plane is inclined from the Y-axis of the crystal by 36 to 45° and the propagation direction of surface acoustic waves is parallel to the X-axis of the crystal (hereinafter also referred to as a "36-45° Y-cut X-propagation LT substrate"). The propagation direction of surface acoustic waves in the oxide crystal substrate OS coincides with the propagation direction of surface acoustic waves in the piezoelectric crystal substrate PS.

The thickness h of the piezoelectric crystal substrate PS is 0.05 to 0.5 μm. As will be described later in detail, the thickness h of the piezoelectric crystal substrate PS is reduced so that the electromechanical coupling coefficient $K^2$ is increased for an odd-order harmonic, so that a SAW filter having a wide passband width is obtained. As a result, it is possible to reduce the number of SAW filters constituting the RF filter RFF shown in FIG. 1, and thereby to reduce the size of the radio receiving circuit RX.

The piezoelectric crystal substrate PS and the oxide crystal substrate OS are directly bonded to each other by, for example, a surface-activated bonding method. Alternatively, the piezoelectric crystal substrate PS and the oxide crystal substrate OS may be bonded to each other through an amorphous intermediate layer interposed therebetween. The amorphous intermediate layer is made of, for example, $SiO_2$ or $Al_2O_3$, and its thickness is, for example, 100 nm or smaller. The amorphous intermediate layer can be formed by known chemical vapor deposition or physical vapor deposition. For example, an amorphous intermediate layer is formed over a surface(s) of one or both of the piezoelectric crystal substrate PS and the oxide crystal substrate OS, and then the piezoelectric crystal substrate PS and the oxide crystal substrate OS are bonded to each other.

The IDT electrode IDT is formed over the piezoelectric crystal substrate PS, and is formed of a metal film such as an aluminum (Al) film or a copper (Cu) film. The thickness of the metal film is, for example, several ten nanometers to several hundred nanometers.

As shown in FIG. 2, the IDT electrode IDT is composed of two comb-like electrodes E1 and E2. One of the electrodes E1 and E2 serves as an input electrode and the other electrode serves as an output electrode.

Specifically, each of the electrodes E1 and E2 includes a plurality of electrode fingers (comb tooth) that are arranged parallel to each other and are connected to one another at one end thereof. Further, the electrodes E1 and E2 are opposed to each other so that each of the electrode fingers of one of the electrodes E1 and E2 is inserted (i.e., interposed) between two adjacent electrode fingers of the other electrode. That is, the electrode fingers of the electrodes E1 and E2 are alternately arranged and parallel to each other.

As shown in FIG. 2, the electrode fingers of the electrodes E1 and E2 extend perpendicularly to the propagation direction of surface acoustic waves over the surface of the piezoelectric crystal substrate PS. Note that the width w of each of the electrode fingers of the electrodes E1 and E2 and the gap g between one of the electrode fingers of the electrode E1 and an adjacent electrode finger of the electrode E2 are constant. That is, the pitch p of the arrangement of the electrode fingers of the IDT electrode IDT (the electrode E1 and E2) is also constant, and is equal to the sum of the width w and the gap g of the electrode fingers. That is, a relation p=w+g holds.

Note that the wavelength λ of the surface acoustic wave is two times the pitch p (λ=2p) and is geometrically determined.

Further, since the center frequency f0 of the fundamental wave of the surface acoustic wave is expressed as f0=v/λ by using the velocity v and the wavelength λ of the surface acoustic wave, the below-shown expression holds.

$$f0=v/\lambda=v/2p=v/2(w+g)$$

Note that the velocity v is determined by the cutting plane, the propagation direction, and the like of the piezoelectric crystal substrate PS. Therefore, it is possible to increases the center frequency f0 of the fundamental wave by reducing the pitch p. Further, the center frequency of an odd-order harmonic is an odd multiple of the center frequency f0 of the fundamental wave. For example, the center frequency of the third harmonic is expressed as 3f0 and the center frequency of the fifth harmonic is expressed as 5f0.

Figure 3:
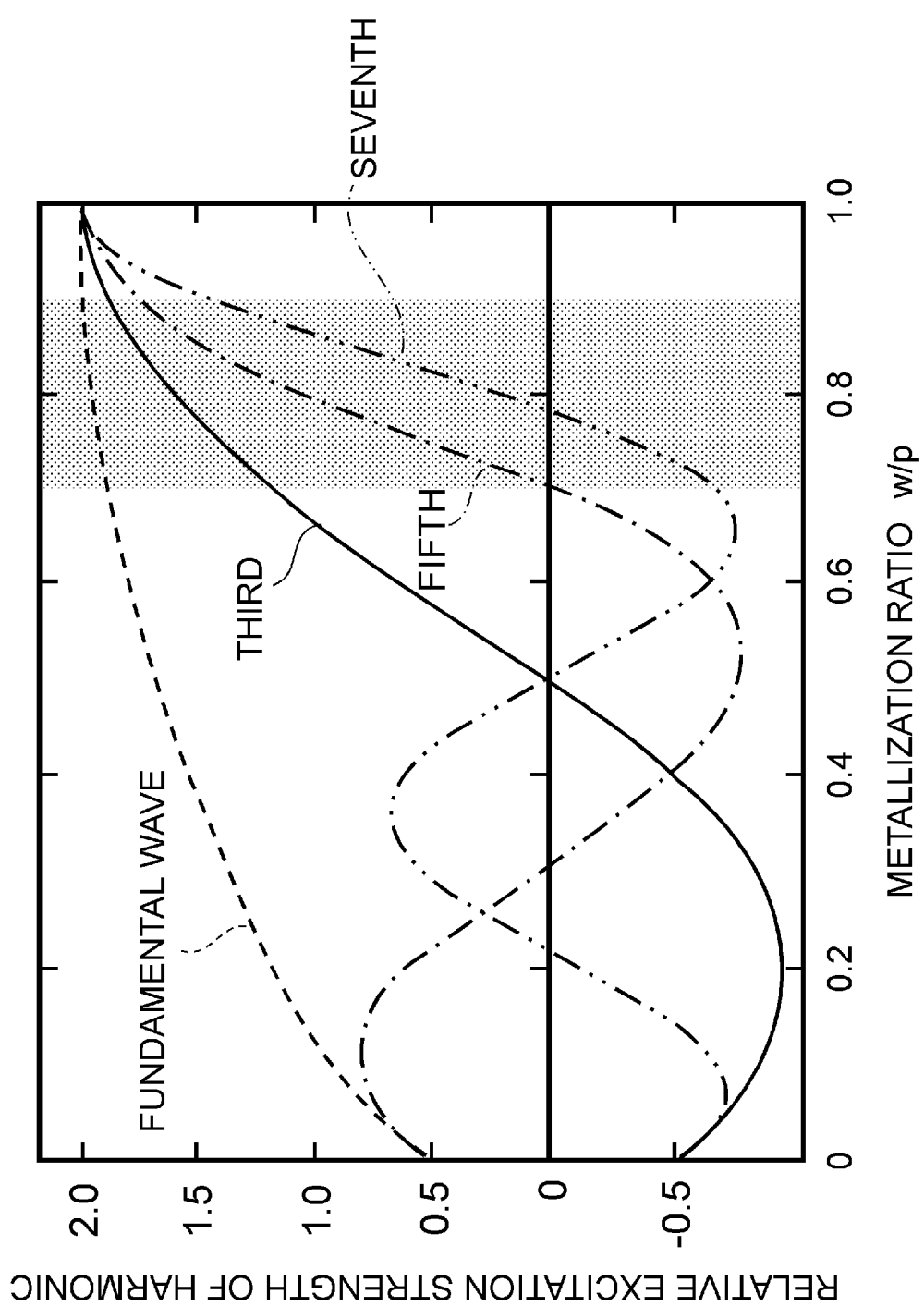
FIG. 3 is a graph showing the dependence of the relative excitation intensity of an odd-order harmonic on the metallization ratio.

Note that FIG. 3 is a graph showing the dependence of the relative excitation intensity of an odd-order harmonic on the metallization ratio (hereinafter also expressed as the metallization-ratio dependence of the relative excitation intensity of the odd-order harmonic). A horizontal axis indicates the metallization ratio w/p (the ratio between the width w and the pitch p of the electrode fingers), and a vertical axis indicates the relative excitation intensity of the odd-order harmonic (the relative strength with respect to that of the fundamental wave). As shown in FIG. 3, the larger the metallization ratio w/p is, the higher the relative excitation intensity of the odd-order harmonic becomes with respect to that of the fundamental wave in the SAW filter.

Note that FIG. 3 is a graph disclosed in Engan.

For example, as indicated by a dot pattern in FIG. 3, the metallization ratio w/p is adjusted to 0.7 to 0.9. In particular, an excellent excitation intensity is obtained in the third harmonic.

When the pitch p is kept constant (i.e., when the center frequency f0 of the fundamental wave is kept constant), the width w of the electrode fingers increases as the metallization ratio w/p increases, so that the resistance of the electrode fingers can be reduced.

Meanwhile, when the metallization ratio w/p exceeds 0.9, the gap g decreases, thus making the manufacturing of the IDT electrode IDT difficult.

The width w of the electrode fingers of the IDT electrode IDT (the electrode E1 and E2) is, for example, 0.2 to 1.5 μm.

Note that in the example shown in FIG. 2, the number of electrode fingers of the electrode E1 is larger than that of electrode fingers of the electrode E2 by one, but may be equal to that of electrode fingers of the electrode E2. Further, the number of electrode fingers of the electrodes E1 and E2 is determined as desired. Further, two or more electrode fingers of one of the electrodes E1 and E2 may be inserted (i.e., interposed) between adjacent electrode fingers of the other of the electrodes E1 and E2.

The reflectors REF1 and REF2 are formed of the same metal film as that for the IDT electrode IDT.

As shown in FIG. 2, each of the reflectors REF1 and REF2 is composed of a plurality of strips that are arranged parallel to each other and connected to one another at both ends thereof. The strips are arranged at the same pitch p as that of the electrode fingers of the electrodes E1 and E2, and disposed in parallel with the electrode fingers of the electrodes E1 and E2. As surface acoustic waves excited by the IDT electrode IDT are reflected by the reflectors REF1 and REF2, they become (or form) a standing wave therebetween, so that a SAW filter having a high Q value and low loss can be obtained.

<Mechanism for Improving Characteristic of Odd-Order Harmonic>

Figure 4:
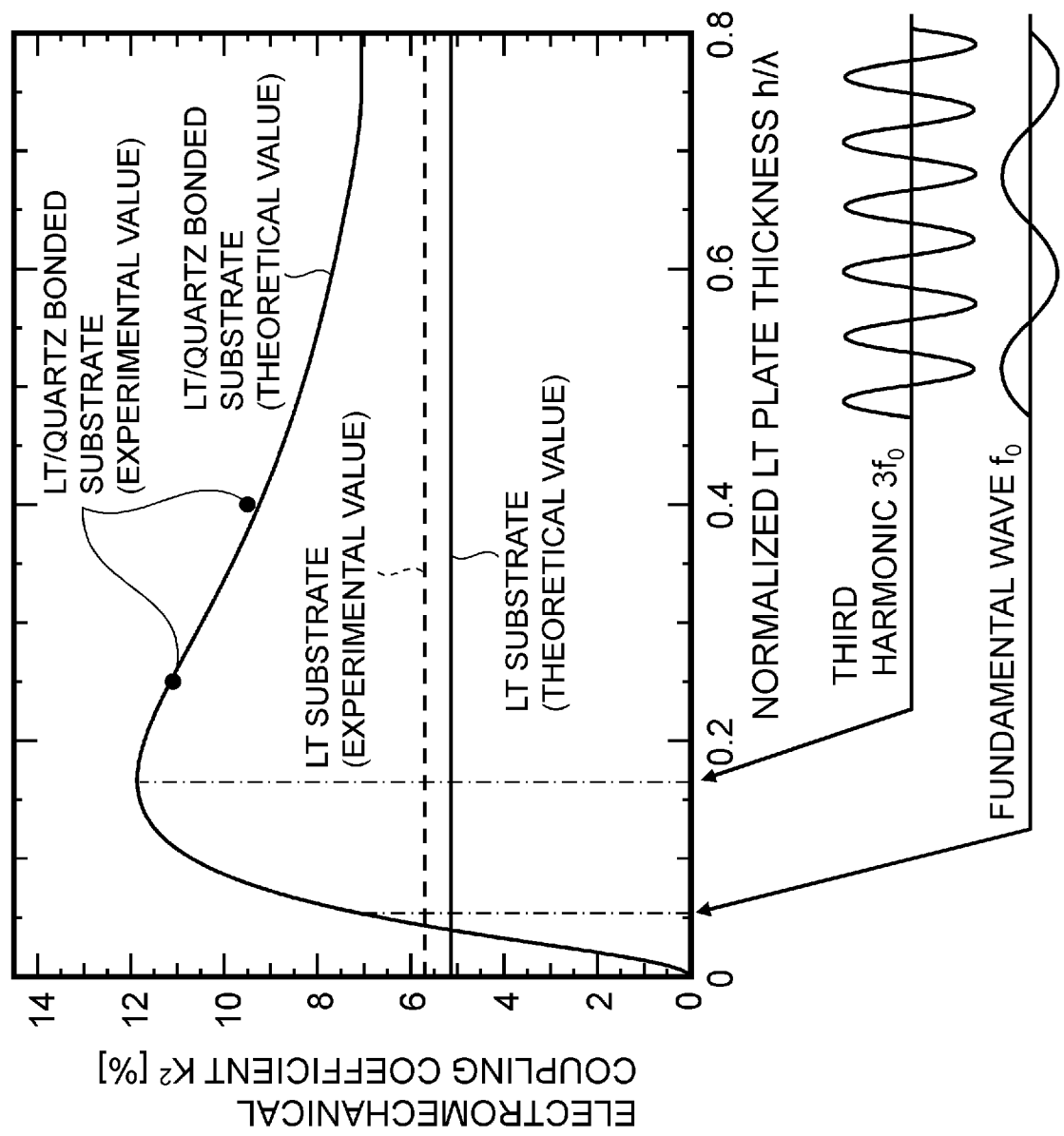
FIG. 4 is a graph showing changes in an electromechanical coupling coefficient $K^2$ of a leaky surface acoustic wave with respect to the thickness h of an LT substrate, normalized based on the wavelength λ of a fundamental wave.

As described above, the SAW filter according to the first embodiment uses an odd-order harmonic instead of using the fundamental wave. Therefore, a mechanism for improving the characteristic of an odd-order harmonic in the SAW filter according to the first embodiment will be described with reference to FIG. 4. FIG. 4 is a graph showing changes in an electromechanical coupling coefficient $K^2$ of a leaky surface acoustic wave (LSAW: Leaky Surface Acoustic Wave) with respect to the plate-thickness h of an LT substrate, normalized based on the wavelength λ of a fundamental wave. A horizontal axis represents the plate-thickness h of the LT substrate normalized based on the wavelength λ (i.e., the normalized plate-thickness h/λ), and a vertical axis represents the electromechanical coupling coefficient $K^2$ of the leaky surface acoustic wave.

FIG. 4 shows theoretical values and experimental values of a 36° Y-cut X-propagation LT substrate alone, and theoretical values and experimental values of a bonded substrate in which an AT-cut 90° X-propagation quartz-crystal substrate (the oxide crystal substrate OS shown in FIG. 2) and a 36° Y-cut X-propagation LT substrate (the piezoelectric crystal substrate PS shown in FIG. 2) are bonded to each other. As shown in FIG. 4, the electromechanical coupling coefficient $K^2$ of the 36° Y-cut X-propagation LT substrate alone is constant irrespective of the normalized plate-thickness h/λ of the LT substrate (hereinafter also referred to as the normalized LT plate thickness h/λ. Meanwhile, the theoretical value of the electromechanical coupling coefficient $K^2$ of the bonded substrate has a peak value of 11.9%, which is two times or larger of the electromechanical coupling coefficient $K^2$ of the LT substrate alone, at or near a point at which the normalized LT plate thickness h/λ is 0.17 (h/λ=0.17).

Not that the graph of theoretical values of the LT substrate alone and theoretical values of the bonded substrate shown in FIG. 4 are the same as that shown in FIG. 8 of Japanese Unexamined Patent Application Publication No. 2019-004308 filed by the inventors of the present application. As shown in Japanese Unexamined Patent Application Publication No. 2019-004308, at or near the point at which the normalized LT plate thickness h/λ is 0.17 (h/λ=0.17), the theoretical value of the temperature coefficient of frequency (TCF: Temperature Coefficient of Frequency) is also roughly zero, and the theoretical value of the propagation attenuation also has a satisfactory value of about $10^{-4}$ dB/λ.

Note that the inventors have considered optimizing the electromechanical coupling coefficient $K^2$ of an odd-order harmonic by using the dependence of the electromechanical coupling coefficient $K^2$ of the bonded substrate shown in FIG. 4 on the normalized LT plate thickness. It should be noted that the graph shown in FIG. 4 is a graph of the plate-thickness h of the LT substrate normalized based on the wavelength λ of the fundamental wave (i.e., the normalized plate-thickness h/λ).

A case where a third harmonic is used will be described. As shown in FIG. 4, the wavelength of the third harmonic is expressed as λ/3. Therefore, in order to make the electromechanical coupling coefficient $K^2$ of the third harmonic have a peak value, the normalized LT plate thickness h/λ is adjusted to one third (⅓) of the normalized LT plate thickness h/λ with which the electromechanical coupling coefficient $K^2$ of the fundamental wave has a peak value. As described above, in the example shown in FIG. 4, since the normalized LT plate thickness h/λ with which the electromechanical coupling coefficient $K^2$ of the fundamental wave has the peak value is 0.17, the normalized LT plate thickness h/λ for the optimum fundamental wave is about 0.057 (0.17/3≈0.057). For example, the LT plate thickness h is adjusted to about 0.05λ to 0.07λ.

Similarly, in the example shown in FIG. 4, when a fifth harmonic is used, the normalized LT plate thickness h/λ for the optimum fundamental wave is about 0.034 (0.17/5=0.034). Therefore, when the fifth harmonic is used, the LT plate thickness h is adjusted to, for example, about 0.03λ 0.04λ.

When the above-described technical matters are generalized, it is expressed as follows. That is, in order to optimize the electromechanical coupling coefficient $K^2$ of a (2n+1)th harmonic (n is a natural number), the normalized LT plate thickness h/λ is adjusted to 1/(2n+1) of the normalized LT plate thickness h/λ with which the electromechanical coupling coefficient $K^2$ of the fundamental wave has a peak value.

As described above, in the SAW filter according to the first embodiment, since a (2n+1)th harmonic is used, the LT plate thickness h is reduced to 1/(2n+1) of the thickness that is used when the fundamental wave is used.

Specifically, in the SAW filter according to the first embodiment, the thickness h of the piezoelectric crystal substrate PS (e.g., an LT substrate) is adjusted to 0.05 to 0.5 µm. Therefore, for example, it is possible to achieve a high electromechanical coupling coefficient $K^2$ by using a (2n+1)th harmonic for use in which a high frequency band, e.g., a band of 1.5 to 20 GHz is used.

Note that the present disclosure can be applied not only to the leaky surface acoustic wave but also to other types of surface acoustic wave propagation modes such as longitudinal leaky surface acoustic waves and Rayleigh surface acoustic waves.

<Analysis of Resonance Characteristic by Simulation>

Figure 5:
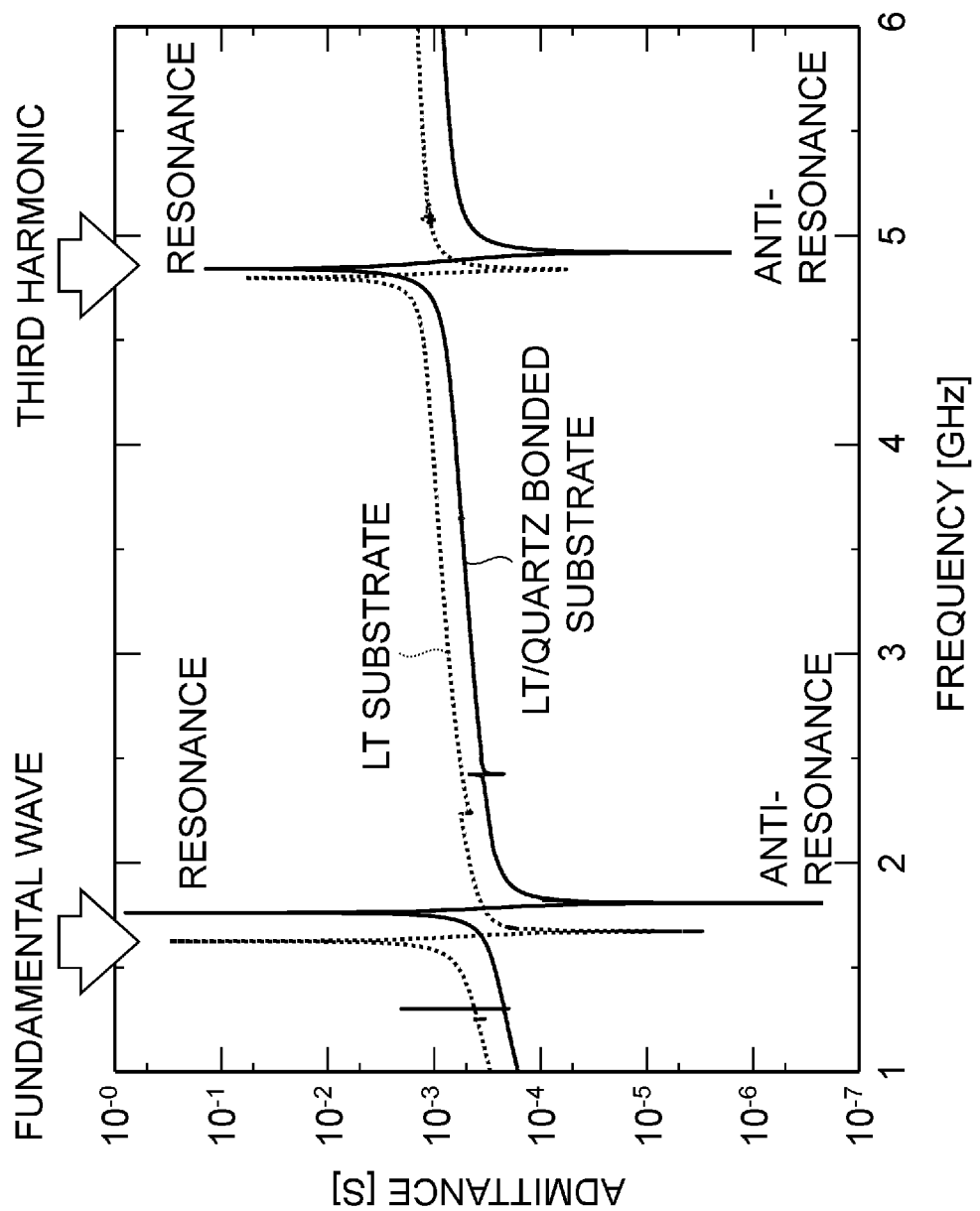
FIG. 5 is a graph showing results of analyses of resonance characteristics by simulations of the SAW filter according to the first embodiment by a simulation for the SAW filter.

Next, results of analyses of resonance characteristics by simulations of the SAW filter according to the first embodiment will be described with reference to FIG. 5. FIG. 5 is a graph showing results of analyses of resonance characteristics by simulations of the SAW filter according to the first embodiment. A horizontal axis indicates the frequency [GHz], and a vertical axis indicates the admittance [S]. FIG. 5 shows a result of an analysis of a 36° Y-cut X-propagation LT substrate alone and a result of an analysis of a bonded substrate in which a 36° Y-cut X-propagation LT substrate is bonded over an AT-cut 90° X-propagation quartz-crystal substrate.

For the above-described LT substrate alone and for the bonded substrate, their resonance characteristics were analyzed based on a finite element method (FEM: Finite Element Method) by using a Femtet manufactured by Murata Software Co., Ltd. The wavelength λ (=2p) of the fundamental wave was 2.5 µm, and the thickness of the support substrate was 10λ. Further, as described above, the LT plate thickness was adjusted to 0.06λ, i.e., 0.15 µm so that the electromechanical coupling coefficient $K^2$ of the third harmonic has a peak value. It was assumed that the IDT electrode IDT shown in FIG. 2 was composed of an aluminum (Al) film having a film-thickness of 70 nm and has an infinite periodic structure. Further, a perfect matched layer (PML: Perfect Matched Layer) was set in the bottom surface of the IDT electrode.

As described above with reference to FIG. 3, the larger the metallization ratio w/p is, the higher the relative excitation intensity of the third harmonic becomes with respect to that of the fundamental wave in the SAW filter. Therefore, the metallization ratio w/p was set to 0.8. That is, the width w of (each of) the electrode fingers of the IDT electrode IDT shown in FIG. 2 was set to 1.0 µm, and the pitch p of the electrode fingers was set to 1.25 µm. Then, a sine-wave AC (Alternating Current) voltage of ±1.0 V was applied to the IDT electrode IDT. The dielectric loss and the mechanical loss of each material were not taken into consideration.

As shown in FIG. 5, a response (resonance and anti-resonance) of the fundamental wave appears at about 1.7 GHz, and a response of the third harmonic appears at about 5 GHz.

Here, admittance ratios, specific bandwidths, resonance Q values, and anti-resonance Q values, which are the results of the analyses, are summarized in Table 1. In Table 1, the third harmonic of the bonded substrate according to this embodiment is indicated by shading.

TABLE 1

|  |  | Admittance ratio [dB] | Specific bandwidth [%] | Resonance Q value | Anti-resonance Q value |
| --- | --- | --- | --- | --- | --- |
| Bonded substrate | Third harmonic | 99 | 1.6 | 6,200 | 13,300 |
|  | Fundamental wave | 131 | 2.6 | 58,700 | 25,800 |
| LT substrate alone | Third harmonic | 61 | 0.8 | 4,800 | 1,200 |
|  | Fundamental wave | 100 | 2.8 | 1,600 | 1,700 |

As shown in Table 1, regarding the admittance ratio, the value for the third harmonic in the bonded substrate according to this embodiment was 99 dB, which was about 1.5 times the value (i.e., 61 dB) for the third harmonic in the LT substrate alone according to the comparative example, and was roughly equal to the value (i.e., 100 dB) for the fundamental wave in the LT substrate alone.

Regarding the specific bandwidth which is affected by the value of the electromechanical coupling coefficient $K^2$ described above with reference to FIG. 4, the value for the third harmonic in the bonded substrate according to this embodiment was 1.6%, which was two times the value (i.e., 0.8%) for the third harmonic in the LT substrate alone according to the comparative example.

Regarding the resonance Q value, as shown in Table 1, the value for the third harmonic in the bonded substrate according to this embodiment was also higher than those for the fundamental wave and the third harmonic in the LT substrate alone according to the comparative example. Further, regarding the anti-resonance Q value, the value for the third harmonic in the bonded substrate according to this embodiment was significantly higher than those for the fundamental wave and third harmonic in the LT substrate alone according to the comparative example.

Further, as shown in FIG. 5, no undesired response was observed for the third harmonic of the bonded substrate according to this embodiment.

As can be understood from the above-described results of the analyses, in the SAW filter according to this embodiment, it was confirmed that it was possible, by reducing the LT plate-thickness h to one third (⅓) of that in the case where the fundamental wave was used, i.e., to 0.15 μm, to enable the SAW filter exhibit remarkably excellent performance in the third harmonic of about 5 GHz. As described above, it is possible, by reducing the thickness h of the piezoelectric crystal substrate (e.g., an LT substrate) to 0.05 to 0.5 μm and by using an odd-order harmonic, to apply the SAW filter according to this embodiment to, for example, use in which a high-frequency band, e.g., a band of 1.5 to 20 GHz is used.

From the disclosure thus described, it will be obvious that the embodiments of the disclosure may be varied in many ways. Such variations are not to be regarded as a departure from the spirit and scope of the disclosure, and all such modifications as would be obvious to one skilled in the art are intended for inclusion within the scope of the following claims.

What is claimed is:

1. A surface acoustic wave filter comprising:
   an oxide crystal substrate;
   a piezoelectric crystal substrate bonded over the oxide crystal substrate; and
   an IDT (Interdigital Transducer) electrode formed over the piezoelectric crystal substrate, wherein
   a thickness of the piezoelectric crystal substrate is 0.05 to 0.5 μm, and
   an odd-order harmonic is used.

2. The surface acoustic wave filter according to claim 1, wherein the odd-order harmonic is a third harmonic.

3. The surface acoustic wave filter according to claim 1, wherein
   a width w of each of electrode fingers of the IDT electrode is 0.2 to 1.5 μm, and
   a ratio w/p between the width w and a pitch p of the electrode fingers is 0.7 to 0.9.

4. The surface acoustic wave filter according to claim 1, wherein
   the oxide crystal substrate is a quartz-crystal substrate, and
   the piezoelectric crystal substrate is a LiTaO₃ substrate.

5. The surface acoustic wave filter according to claim 4, wherein
   the oxide crystal substrate is an AT-cut 0-90° X-propagation quartz-crystal substrate, and
   the piezoelectric crystal substrate is a 36-45° Y-cut X propagation LiTaO₃ substrate.

6. A method for manufacturing a surface acoustic wave filter, comprising the steps of:
   (a) bonding a piezoelectric crystal substrate having a thickness of 0.05 to 0.5 μm over an oxide crystal substrate; and
   (b) forming an IDT (Interdigital Transducer) electrode over the piezoelectric crystal substrate, wherein
   a thickness of the piezoelectric crystal substrate is 0.05 to 0.5 μm, and
   the surface acoustic wave filter uses an odd-order harmonic.

7. The method for manufacturing the surface acoustic wave filter according to claim 6, wherein the odd-order harmonic is a third harmonic.

8. The method for manufacturing the surface acoustic wave filter according to claim 6, wherein
   a width w of each of electrode fingers of the IDT electrode is 0.2 to 1.5 μm, and
   a ratio w/p between the width w and a pitch p of the electrode fingers is 0.7 to 0.9.

9. The method for manufacturing the surface acoustic wave filter according to claim 6, wherein
   the oxide crystal substrate is a quartz-crystal substrate, and
   the piezoelectric crystal substrate is a LiTaO₃ substrate.

10. The method for manufacturing the surface acoustic wave filter according to claim 9, wherein
    the oxide crystal substrate is an AT-cut 0-90° X-propagation quartz-crystal substrate, and
    the piezoelectric crystal substrate is a 36-45° Y-cut X propagation LiTaO₃ substrate.

* * * * *